United States Patent [19]
Kou et al.

[11] Patent Number: 5,650,008
[45] Date of Patent: Jul. 22, 1997

[54] METHOD FOR PREPARING HOMOGENEOUS BRIDGMAN-TYPE SINGLE CRYSTALS

[75] Inventors: Sindo Kou; Ying Tao, both of Madison, Wis.

[73] Assignee: Advanced Materials Processing, LLC, Madison, Wis.

[21] Appl. No.: 564,680

[22] Filed: Dec. 1, 1995

[51] Int. Cl.$^6$ ........................................... C30B 11/04
[52] U.S. Cl. ........................ 117/81; 117/82; 117/83; 117/200; 117/206
[58] Field of Search ........................... 117/2, 31, 33, 117/54, 81, 82, 83, 200, 206, 219, 220, 934

[56] References Cited

U.S. PATENT DOCUMENTS

| 3,033,660 | 5/1962 | Okkerse | 117/33 |
| 4,242,307 | 12/1980 | Fally | 117/83 |
| 5,047,113 | 9/1991 | Ostrogorsky | 117/83 |

FOREIGN PATENT DOCUMENTS

| 61-77694 | 4/1986 | Japan . |
| 61-247681 | 11/1986 | Japan . |
| 62-148390 | 7/1987 | Japan . |
| 2-167883 | 6/1990 | Japan . |
| 1412687 | 11/1975 | United Kingdom ............ 117/83 |

OTHER PUBLICATIONS

Ostrogorski et al. 1993 J. Crystal Growth, vol. 128, p. 201.

*Primary Examiner*—Felisa Garrett

[57] ABSTRACT

Growth of homogeneous single crystals is carried out by a modified Bridgman-type process using a second melt of a different composition to replenish the first melt of a predetermined composition held in the crystal growth container. By controlling the replenishing rate and suppressing diffusion between the two melts, composition variations in the first melt and hence the growing crystal are compensated. The second melt may be maintained at a predetermined higher temperature than the first melt. The first melt may be agitated during crystal growth by rotation. A liquid encapsulant may be used.

20 Claims, 11 Drawing Sheets

METHOD FOR PREPARING HOMOGENEOUS BRIDGMAN-TYPE SINGLE CRYSTALS

This invention was made with United States Government support awarded by the National Science Foundation (NSF), Grant No. DMR 9415482. The United States Government has contained certain rights in this invention.

FIELD OF THE INVENTION

This invention relates to the control over the composition of alloyed or doped single crystals grown by the Bridgman-type methods.

BACKGROUND OF THE INVENTION

Single crystals are used in the manufacture of a wide variety of products, such as integrated circuits, optical systems and various other devices. The Bridgman-type methods are often used to grow single crystals from a melt. A synopsis of these methods is given below.

In the vertical Bridgman method the polycrystalline charge is melted in a tube-like container positioned in the hotter portion of a vertical furnace. The container is then lowered slowly into the cooler portion of the furnace to cause the melt to solidify from the bottom of the container. Alternatively, the container can remain stationary while the furnace is raised slowly. The container is designed such that its bottom is reduced gradually to a tube smaller in cross-section to help the melt solidify into a single crystal. If desired, a seed crystal can be placed in the bottom tube.

In the horizontal Bridgman method the polycrystalline charge is melted in a boat-like container positioned in the hotter portion of a horizontal furnace. The container is then pulled slowly into the cooler portion of the furnace to cause the melt to solidify. Alternatively, the container can remain stationary while the furnace is pulled in the opposite direction. The container is designed such that the end at which solidification begins is reduced gradually to a smaller cross-section to help the melt solidify into a single crystal.

The gradient-freeze method is in fact a Bridgman-type method. The container for crystal growth is identical to that in the Bridgman method. The charge is also melted in a container which is positioned in the hotter portion of the furnace. However, the container and the furnace both remain stationary. The location of the steep temperature gradient between the hotter and cooler portions is then caused to shift along the furnace. This in turn causes the melt to solidify along the container like in the Bridgman method. Crystals can be grown either vertically or horizontally.

Single crystals are often alloyed or doped with a solute to develop the desired physical properties. The solute can be an element or a compound, and its concentration can range from as high as a few per cent or greater to as low as around $10^{17} \sim 10^{18}$ atoms per cubic centimeter.

At the growth front, i.e., the interface between the crystal and the melt, the solubility of the solute in the crystal $C_S$ often differs significantly from that in the melt $C_L$. This difference is measured by a segregation coefficient defined as $k=C_S/C_L$. For $k<1$, the solid cannot hold as much solute as the melt. As such, the solute is rejected by the growing crystal into the melt. This causes the melt solute concentration at the growth front $C_L$ to increase, which in turn causes the crystal solute concentration at the growth front $C_S$ ($=kC_L$) to increase. Consequently, the solute concentration increases along the axis of the resultant crystal. For $k>1$, the opposite is true. In either case the extent of solute segregation increases with the extent of convection in the melt.

Most attempts to control solute segregation in Bridgman-type crystal growth can be grouped into two categories, i.e., melt convection control and melt composition control. In the first category convection in the melt is reduced. A magnetic field was used to damp convection. See, e.g., H. P. Utech et al., J. Applied Physics, vol. 37, 1966, p. 2021. Microgravity was used to reduce buoyancy convection. See, e.g., A. F. Witt et al., J. Electrochemi. Soc., vol. 122, 1975, p. 276. Centrifugation was also used. See H. Rodot et al., J. Crystal Growth, vol. 104, 1990, p. 280. A disk heater was submerged in the melt to suppress convection near the growth front. See A. G. Ostrogorsky, U.S. Pat. No. 5,047,113. A series of closely spaced partitions were immersed in the melt to reduce convection. See Japanese Pat No. 62,012,691. These methods are not effective for k far from unity.

In the second category, which is not subject to this deficiency, variations in the composition of the (first) melt are compensated by replenishing with a material of a different composition and segregation is thus reduced. A solid was dropped into the melt in vertical Bridgman crystal growth. See Japanese Pat. No. 61,077,694. A second melt was provided in a crucible above the first melt in vertical Bridgman crystal growth and allowed to drip by itself from a bottom hole of the crucible into the first melt. See Japanese Pat. No. 62,148,390. A second melt was provided in a crucible immersed in the first melt in vertical gradient-freeze crystal growth and allowed to leak from a bottom hole (1 mm long and 1.5 mm in diameter) of the crucible into the melt. See Japanese Pat. No. 02,167,883. In vertical Bridgman crystal growth with a submerged disk heater, a second melt was provided over the heater to feed the first melt under it. See A. G. Ostrogorsky et al., J. Crystal Growth, vol. 128, 1993, p. 201. A second melt was enclosed in a cylinder-piston assembly immersed in the first melt in horizontal Bridgman crystal growth and injected into the first melt through the bottom hole (around 1 mm long) of the cylinder. See Japanese Pat. No. 61,247,681.

Dropping solid into the melt can result in polycrystals if the solid is not melted completely. The feed rate is not controlled if the second melt drips by itself from a crucible. Variations in the feed rate can cause the composition of the first melt to vary, which in turn causes the composition of the growing crystal to vary. In fact, dripping from the bottom hole of a crucible can be erratic if a melt does not wet the crucible, e.g., a semiconductor or metal melt in a quartz or boron nitride crucible. A short passageway connecting a second melt to the first melt can be insufficient for suppressing solute diffusion between the two melts. A hole through the thin bottom wall of an immersed crucible or cylinder is often too short. In some cases even the annular space between a submerged disk heater and the inner wall of the crystal growth container can be too short. Diffusion causes the compositions of both melts to vary, which in turn causes the composition of the growing crystal to vary.

SUMMARY OF THE INVENTION

It is, therefore, an object of the present invention to provide a method for growing single crystals with a uniform composition.

The present invention comprises replenishing at a controlled rate the melt from which the crystal is being grown, with a melt different in composition and with suppression of solute diffusion between the two melts. The first melt, hereafter called the growth melt, is held in the container in which the crystal is to be grown. The second melt, hereafter called the replenishing melt, is to compensate for composition variations in the growth melt and hence the growing crystal. Such variations are compensated by controlling the replenishing rate and by suppressing solute diffusion between the growth melt and the replenishing melt. Diffusion is suppressed by making the passageway between the two melts too difficult to diffuse through. Since the distance between the two melts can be relatively long, the second melt can be kept at a predetermined higher temperature than the first melt, as often required in growing highly alloyed single crystals and in solution growth. When the second melt is held in a separate crucible, the first melt can be agitated by rotating the container. A liquid encapsulant can be used to suppress evaporation from the melts.

DETAILED DESCRIPTION OF THE PREFERRED EMBODIMENTS

The embodiments of the present invention will now be described below, with reference to the accompanying drawings.

Figure 1:
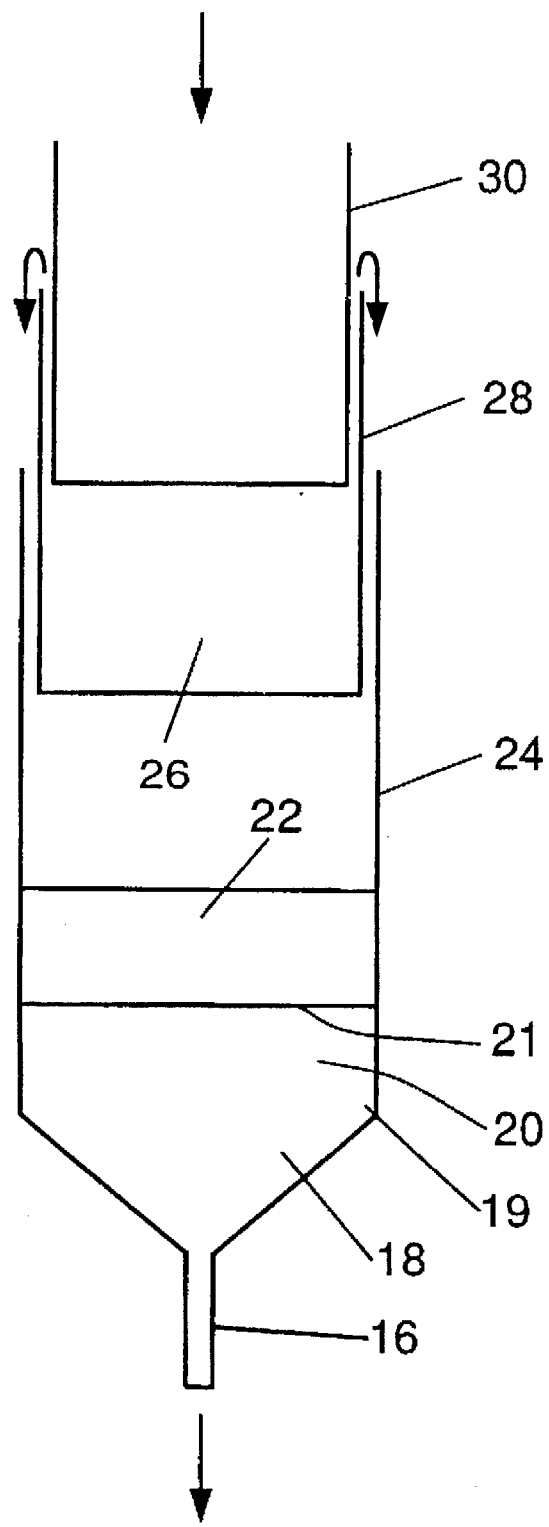
FIG. 1 is a longitudinal sectional view showing modified vertical Bridgman crystal growth according to the present invention, the replenishing melt being supplied from an elevated crucible at a controlled rate.

In FIG. 1 a crystal 20 is growing from a growth melt 22 in a container 24. The bottom of the container is reduced conically and connected to a small tube 16. The container 24 is lowered slowly into the cooler portion of the furnace (not shown) to initiate crystal growth. The small tube 16 helps the melt in it solidify into a single crystal. Alternatively, a single crystal seed (not shown) can be placed in the tube 16 for the same purpose. After going through a conical expansion 18 and reaching a shoulder 19, the crystal 20 grows with a growth front 21 in the main body of the container 24.

To compensate for variations in the volume and composition of the growth melt 22, a replenishing melt 26 is supplied from a replenishing crucible 28 above the growth melt 22. A dummy 30, in the form of a solid rod or a bottom-sealed tube immersed in the replenishing melt 26, is lowered at a predetermined rate to cause the replenishing melt 26 to overflow the replenishing crucible 28.

The replenishing crucible 28 and the dummy 30 are constructed of a material of low contamination risk. The material of the container 24 is a good candidate, e.g., quartz, pyrolytic boron nitride, high purity graphite or platinum.

To grow the crystal 20 at a uniform solute concentration $C_o$, the growth melt 22 should be kept constant at $C_o/k$, where k is the segregation ratio. It is also desirable to keep the growth melt 22 constant in volume. It can be shown from the mass balance of the solute in the growth melt 22 that the desired solute concentration C of the replenishing melt 26 can be determined from the following equation $$\frac{C}{C_o} = \frac{1}{k}\left[1-(1-k)\frac{A_{growth} V_{growth}}{A_{dummy} V_{dummy}}\right] \quad [1]$$

where $A_{growth}$ is the inner cross-sectional area of the container 24, $V_{growth}$ the nominal growth rate (i.e., the lowering speed of the container 24), $A_{dummy}$ the outer cross-sectional area of the dummy 30 and $V_{dummy}$ the lowering speed of the dummy. The composition and volume of the growth melt 22 are assumed constant. For the simplest case of $C=C_o$, i.e., the replenishing melt 26 is chosen to have the same composition as the desired crystal composition $C_o$, the dummy lowering speed according to Eqn. [1] is as follows $$V_{dummy} = \frac{A_{growth} V_{growth}}{A_{dummy}} \quad [2]$$

The composition of the initial charge in the container 24 is predetermined such that the composition of the growth melt 22 becomes around $C_o/k$ when the crystal 20 grows to its shoulder 19. At this point replenishing is started to help keep both the volume and composition of the growth melt 22 constant during growth. Replenishing can be started earlier, e.g., when the crystal 20 reaches the top of the bottom tube 16. The dummy lowering speed, however, will have to be increased gradually as the crystal diameter increases gradually in the conical portion 18. Since the conical portion 18 of the crystal is usually not used, starting replenishing earlier is usually unnecessary.

One advantage of the embodiment shown in FIG. 1 is that the replenishing rate can be precisely controlled. A motor or stepping motor can be used to control the lowering speed of the dummy 30. Another advantage is that composition variations of the growth melt 22 due to solute diffusion with the replenishing melt 26 cannot occur. This is because the two melts are not connected to each other, i.e., the passageway between the two melts are discontinuous at all time. Still another advantage is that the container 24 can be rotated to help keep the growth front 21 flat and the growth melt 22 uniform in composition, as in Bridgman crystal growth with the accelerated crucible rotation technique (ACRT). Yet another advantage is that the replenishing melt 26 can be maintained at a predetermined higher temperature than the growth melt, in view of the relatively long distance between the two melts. This is often desirable in the growth of highly alloyed single crystals where the liquidus temperature of the replenishing melt 26 can be significantly higher than that of the growth melt 22. The liquidus temperature is the lowest temperature a material can remain completely molten. This temperature difference is often required in solution growth, too.

Figure 2:
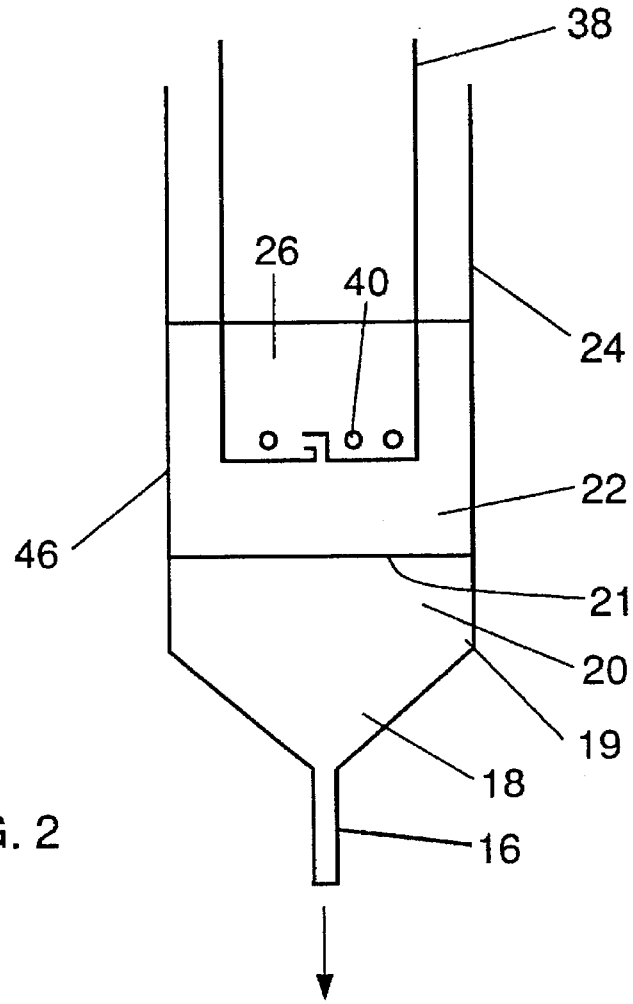
FIG. 2 is a longitudinal sectional view showing modified vertical Bridgman crystal growth according to the present invention, the replenishing melt being supplied from an immersed crucible having a spiral melt passageway.

In the embodiment shown in FIG. 2 a replenishing crucible 38 is immersed in the growth melt 22 rather than above it. At the bottom of the replenishing crucible 38 is a spiral tube 40, rather than a mere hole. Such a spiral tube can be easily prepared from a quartz or platinum tube. The replenishing crucible 38 remains stationary or is raised slowly while the container 24 is lowered. This causes the replenishing melt 26 to leak out through the spiral tube to feed the growth melt 22.

Figure 3:
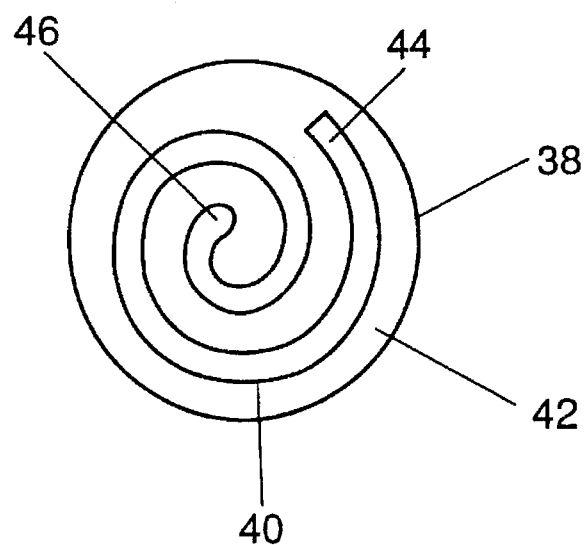
FIG. 3 is a top view of the replenishing crucible shown in FIG. 2.

FIG. 3 is a top view of the bottom of the replenishing crucible 38. During crystal growth the replenishing melt 26 enters the spiral 40 through an entrance 44 and leaves through an exit 46. The spiral tube 40 forms a long melt passageway 42 between the growth melt 22 and the replenishing melt 26.

It is well known that for diffusion from a high solute concentration $C_{high}$ to a low one $C_{low}$ $$\frac{C_{high} - C}{C_{high} - C_{low}} = erf\left(\frac{x}{2\sqrt{Dt}}\right) \quad [3]$$

where D is the diffusion coefficient, t the diffusion time, C the solute concentration at a distance x from $C_{high}$, and erf is the error function. Since erf (1)=0.84, the length of the melt passageway has to be at least $2\sqrt{Dt}$ in order to keep the solute from diffusing through the melt passageway significantly. In fact, since erf (2)=0.99, a melt passageway 4 $\sqrt{Dt}$ in length is even more effective. With the present invention a melt passageway $\geq 2\sqrt{Dt}$ can be easily provided. The diffusion coefficient D is usually around $5 \times 10^{-5}$ cm$^2$/sec (for phosphorus in silicon D can be ten times greater!). The bottom tube 16 of the container is around 3.5 cm in length and the conical reduction 18 is another 1.5 cm. In addition, the container 24 needs to travel a short distance, say around 2.5 cm before solidification starts (when not using a seed crystal). The growth rate is usually 0.1 to 1.0 cm/hr, depending on the level of solute concentration. As such, the time interval t from melting to the commencement of replenishing (when the crystal 20 grows to its shoulder 19) can range from around 5 to 50 hours. This corresponds to a $2\sqrt{Dt}$ of around 2 to 7 cm. Therefore, a short passageway is insufficient to suppress solute diffusion effectively.

One advantage of the embodiment shown in FIG. 2 is that a long passageway can be easily provided, longer than 2 $\sqrt{Dt}$ to suppress solute diffusion. As already mentioned, the time interval t from melting to replenishing can be very long depending on the crystal growth condition involved. Another advantage is that the container 24 and the immersed crucible 38 can be rotated independently. Still another advantage is that a liquid encapsulant can be used to cover the melts. $B_2O_3$ is often used as a liquid encapsulant to suppress evaporation from melts, e.g., GaAs and InP.

During replenishing mass transfer through the passageway tends to be dominated by convection and diffusion can be less a problem. As such, a melt passageway $2\sqrt{Dt}$ is sufficient to suppress solute diffusion between the melts during replenishing.

Figure 4:
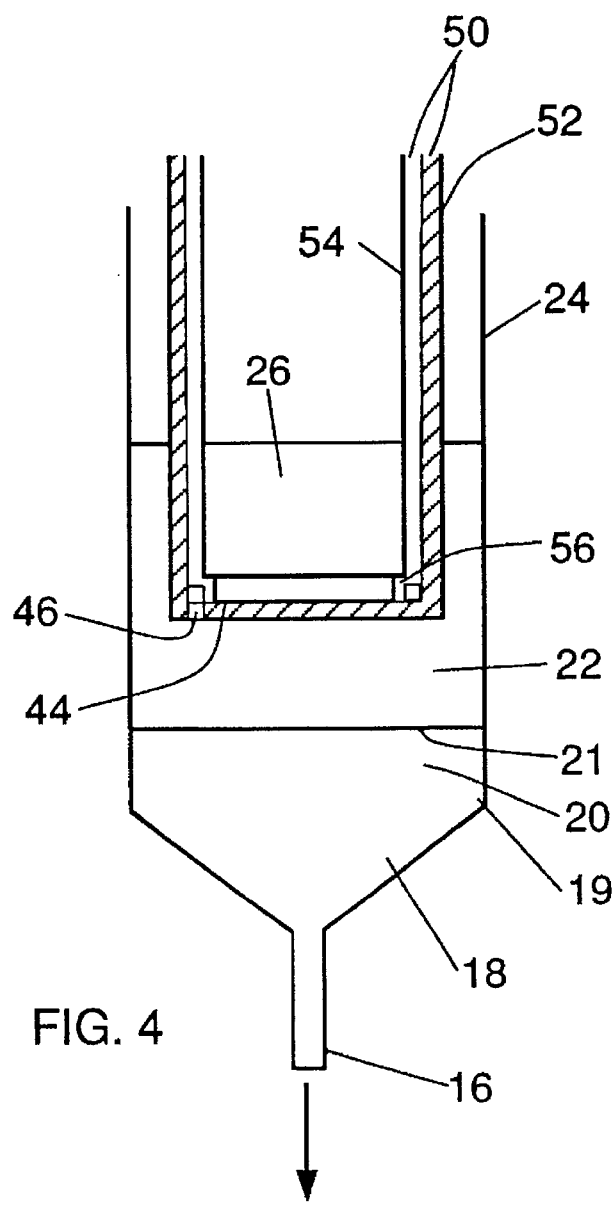
FIG. 4 is a longitudinal sectional view showing modified vertical Bridgman crystal growth according to the present invention, the replenishing melt being supplied from an immersed crucible having a circular melt passageway.
Figure 5:
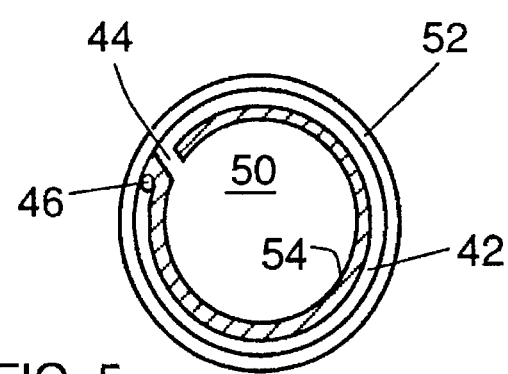
FIG. 5 is a transverse sectional view of the immersed crucible shown in FIG. 4, at the height of the circular melt passageway.

FIG. 4 shows an embodiment similar to that of FIG. 2, but with an immersed crucible 50 consisting of an outer piece 52 and an inner piece 54. The bottom of the inner piece 54 has a step reduction in diameter 56. When mated together, the two pieces form a passageway 42 which is nearly a complete circle, as shown in the transverse sectional view in FIG. 5. Such an immersed crucible can be prepared from pyrolytic boron nitride or high purity graphite. The replenishing melt 26 enters the passageway through an entrance 44 and leaves through an exit 46. The advantages of this embodiment are similar to those of the embodiment shown in FIG. 2.

It can be shown from the mass balance of the solute that the composition of the replenishing melt C can be determined from the following equation $$\frac{C}{C_o} = \frac{1}{k}\left[1 - (1-k)\frac{A_{growth} V_{growth}}{A_{immersed}(V_{growth} + V_{immersed})}\right] \quad [4]$$

where $A_{immersed}$ is the inner cross-sectional area of the immersed crucible and $V_{immersed}$ the lifting speed of the immersed crucible.

Figure 6:
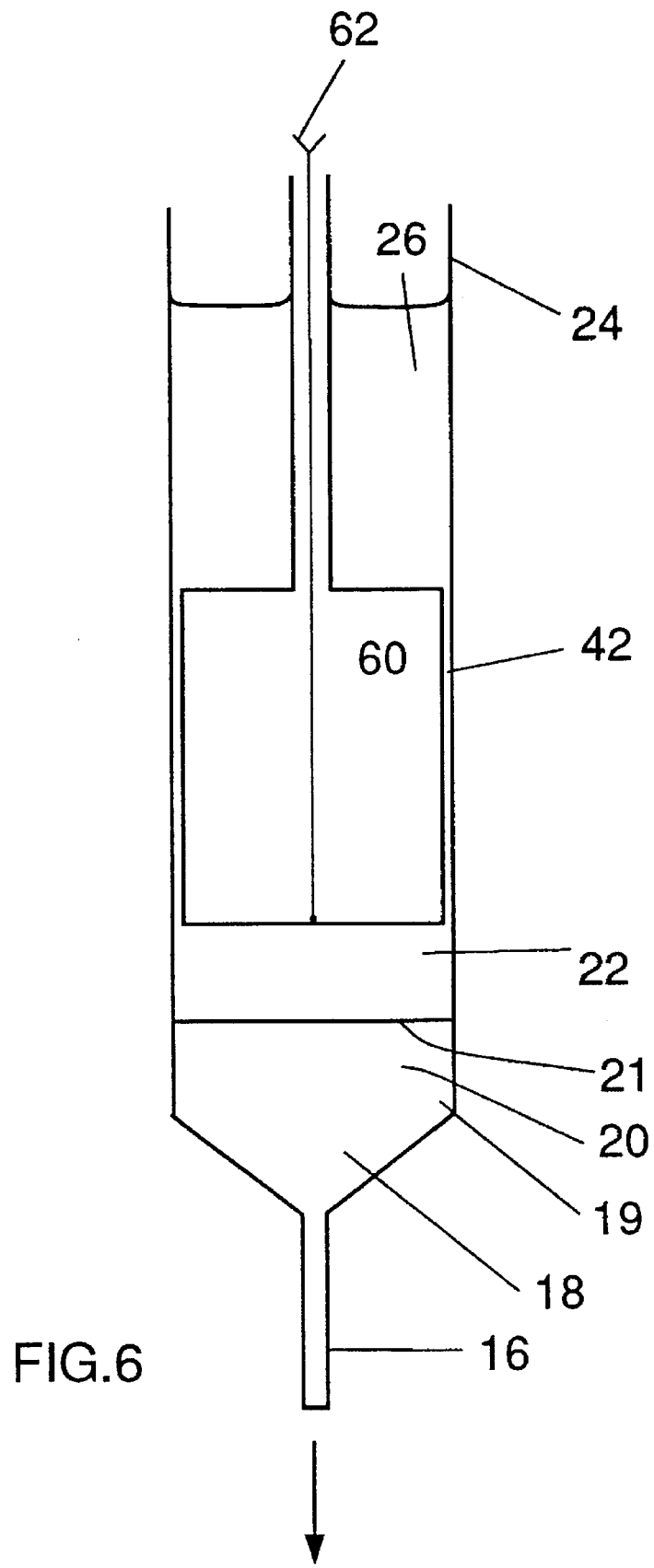
FIG. 6 is a longitudinal sectional view showing modified vertical Bridgman crystal growth according to the present invention, the replenishing melt being supplied from above a submerged cylindrical baffle forming an annual melt passageway with the container wall.

In FIG. 6 the melt passageway 42 is the annular space between a submerged cylindrical baffle 60 and the container 24. The submerged baffle 60 is held stationary while the container 24 is lowered slowly, to cause the replenishing melt 26 to feed the growth melt 22. The submerged cylindrical baffle 60 is high enough to form a melt passageway at least $2\sqrt{Dt}$ in length. The composition of the replenishing melt 26 is identical to the desired composition $C_o$ of the crystal 20.

The submerged cylindrical baffle 60 can be prepared from a material of low contamination risk. The material of the container 24 is a good candidate, e.g., quartz, pyrolytic boron nitride, high purity graphite or platinum. It can be solid or hollow inside. A thermocouple 62 can be used to monitor the temperature at the bottom of the submerged cylindrical baffle 60.

One advantage of the embodiment shown in FIG. 6 is that the passageway is long enough to suppress solute diffusion between the two melts. A submerged disk may be too short to guarantee diffusion suppression in some cases. Another advantage is that the replenishing melt 26 can be maintained at a higher temperature than the growth melt 22, in view of the relatively long distance between the two melts. Still another advantage is that a liquid encapsulant can be used to cover the replenishing melt 26 and prevent evaporation.

Figure 7:
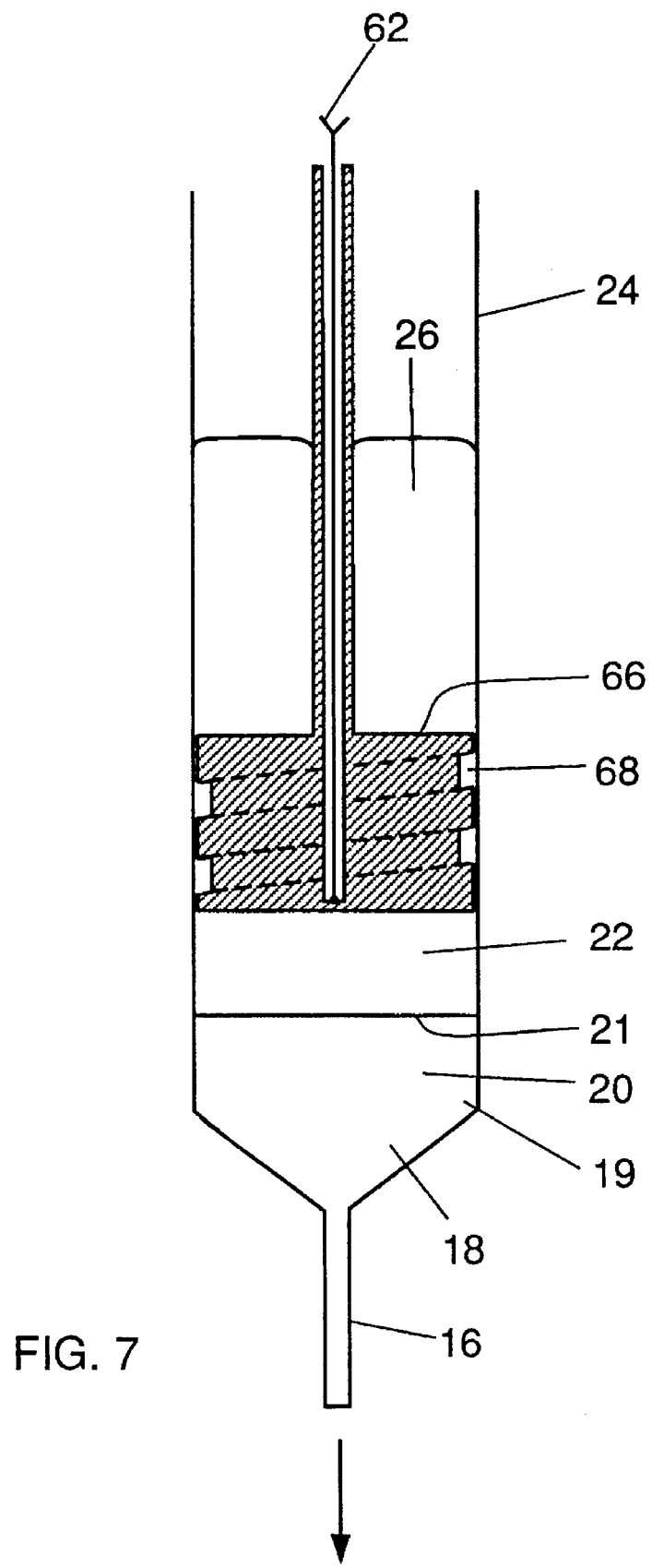
FIG. 7 is a longitudinal sectional view showing modified vertical Bridgman crystal growth according to the present invention, the replenishing melt being supplied from above a submerged cylindrical baffle forming a coil-like melt passageway with the container wall.

Melts of semiconductors and metals often do not wet materials such as pyrolytic boron nitride and graphite. A nonwetting melt may have trouble going through a very narrow passageway between a submerged cylindrical baffle and the inner wall of the container. Under such circumstances, a coil-like groove 68 can be provided around a submerged cylindrical baffle 66, as shown in FIG. 7. The groove 68 is large enough in cross-section to let the replenishing melt 26 pass through easily. A long melt passageway can be provided even with a relatively short submerged cylindrical baffle.

Figure 8:
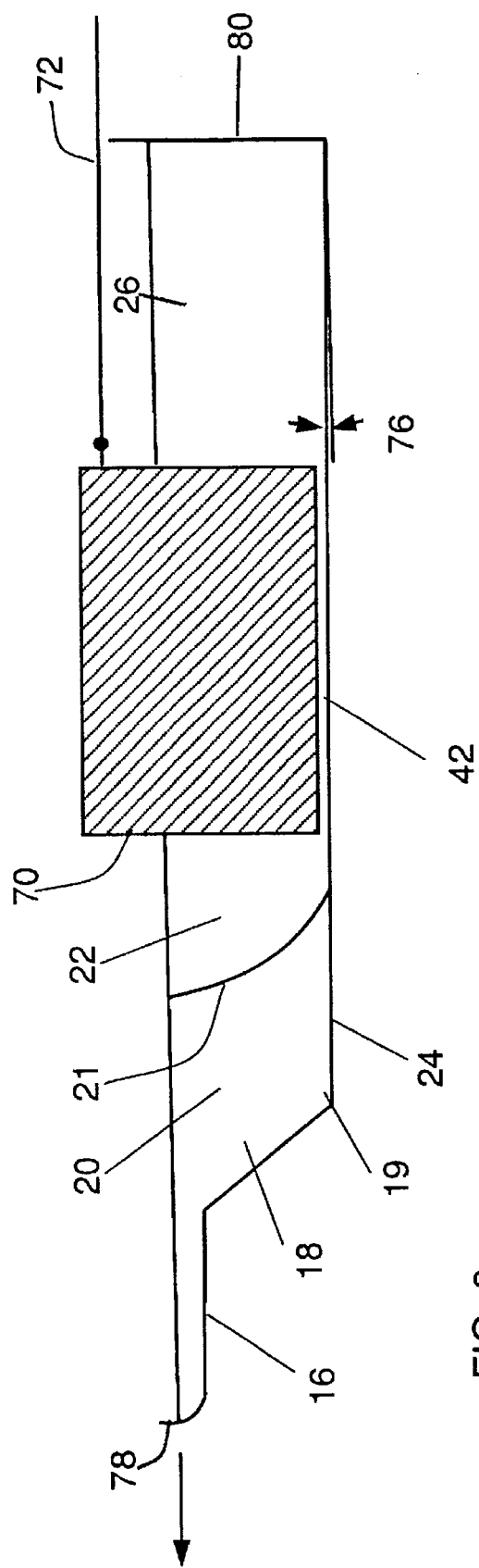
FIG. 8 is a longitudinal sectional view showing modified horizontal Bridgman crystal growth according to the present invention, the replenishing melt being supplied from ahead of an immersed plug having a passageway connecting the growth and replenishing melts.

In FIG. 8 the melt passageway 42 is the space between an immersed baffle 70 and the container 24, i.e., the boat. The immersed baffle 70 is held stationary with a connecting rod 72 while the container 24 is pulled away slowly, to cause the replenishing melt 26 to feed the growth melt 22. The immersed baffle 70 is long enough to form a melt passageway at least $2\sqrt{Dt}$ in length. The composition of the replenishing melt 26 is identical to the desired composition $C_o$ of the crystal 20.

Figure 9:
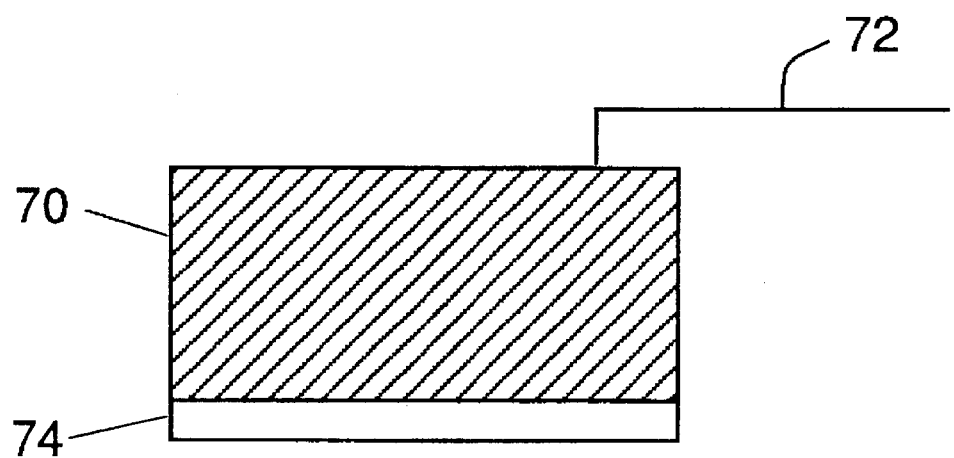
FIG. 9 is a longitudinal sectional view of the immersed plug shown in FIG. 8 but with a bottom groove.
Figure 10:
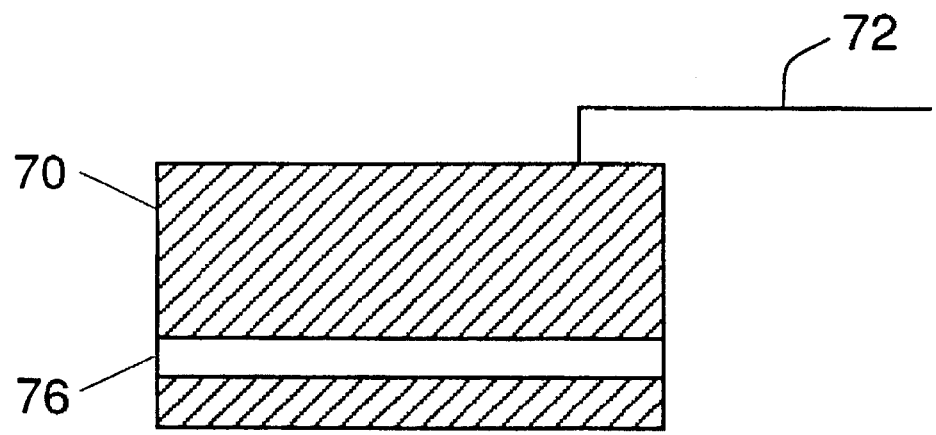
FIG. 10 is a longitudinal sectional view of the immersed plug shown in FIG. 8 but with a through hole.

The immersed baffle 70 can be prepared from a material of low contamination risk. The material of the container 24 is a good candidate, e.g., quartz, pyrolytic boron nitride, high purity graphite or platinum. It can be solid or hollow inside. For nonwetting melts the immersed baffle 70 can be prepared to have a groove 74 in the bottom surface, as shown in FIG. 9, or a hole 76, as shown in FIG. 10. The groove 74 and the hole 76 have a cross-section large enough for the replenishing melt 26 to pass through during replenishing. The groove and the hole can be so prepared as to wind around to further lengthen the passageway.

The density of the growth melt $\rho_L$ Can differ appreciably from that of the crystal $\rho_S$. Referring to FIG. 8, to keep the volume and hence composition of the growth melt 22 constant the container 24 (i.e., the boat) has to have a small tilt angle 76. If $P_S > \rho_L$ the crystal end 78 of the container 24 should be raised slightly, i.e., the tilt angle 76 is positive. If $\rho_S < \rho_L$, the replenishing-melt end 80 of the container 24 should be raised, i.e., the tilt angle 76 is negative.

One advantage of the embodiment shown in FIG. 8 is the long passageway to suppress solute diffusion between the two melts. Another advantage is that the replenishing melt 26 can be maintained at a predetermined higher temperature than the growth melt 22, in view of the relatively long distance between the two melts.

EXAMPLES

Example 1

Vertical Growth of InSb Crystals

Figure 11:
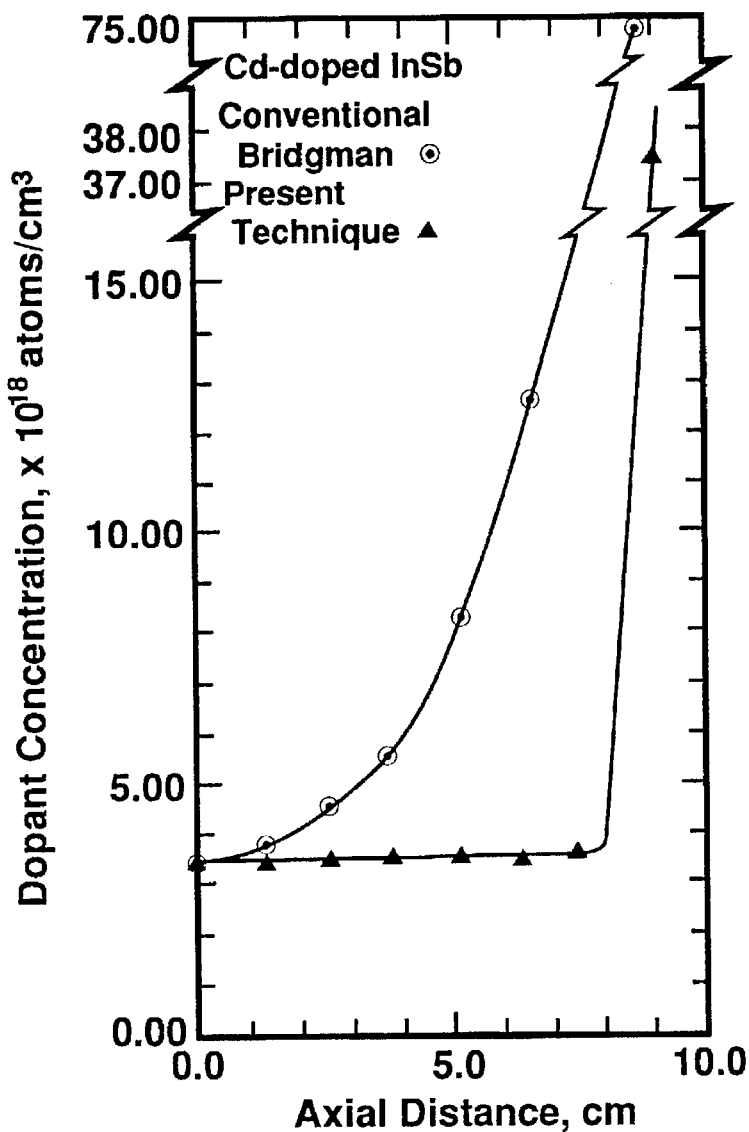
FIG. 11 is a graph showing the axial concentration distributions of Cd in InSb single crystals grown by conventional Bridgman and by using the device shown in FIG. 1.
Figure 12:
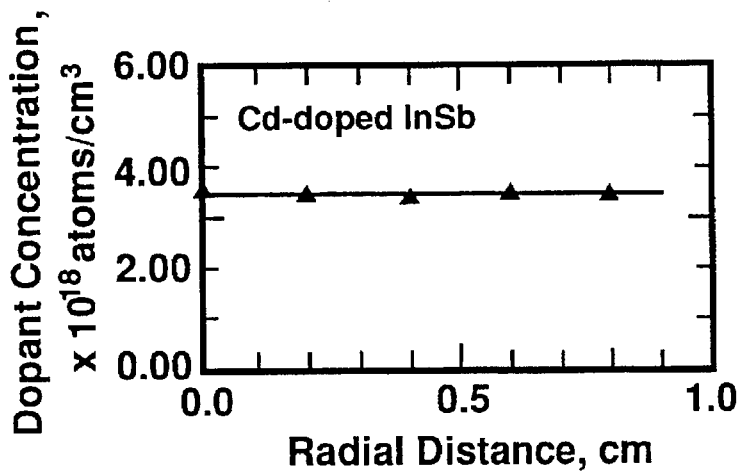
FIG. 12 is a graph showing the transverse concentration distribution of Cd in the modified-Bridgman InSb single crystal shown in FIG. 11.

A modified Bridgman method of crystal growth according to the embodiment shown in FIG. 1 was used to produce a Cd-doped InSb single crystal. The container 24, replenishing crucible 28 and dummy 30 were all prepared from fused quartz. The container 24 (1.8 cm ID) was lowered initially at 0.5 cm/hr and at 1 cm/hr after the commencement of replenishing. The axial Cd distribution along the resultant crystal is shown in FIG. 11. The axial distance is measured from the shoulder of the crystal. Except for the last portion of the crystal, wherein segregation control stopped upon depletion of the replenishing melt, the Cd distribution is uniform. The radial Cd distribution, shown in FIG. 12, is also uniform. The axial Cd distribution in a crystal grown by conventional vertical Bridgman, also included in FIG. 11 for comparison, shows significant segregation over the entire crystal.

Example 2

Vertical Growth of NaNO$_3$ Crystals

Figure 13:
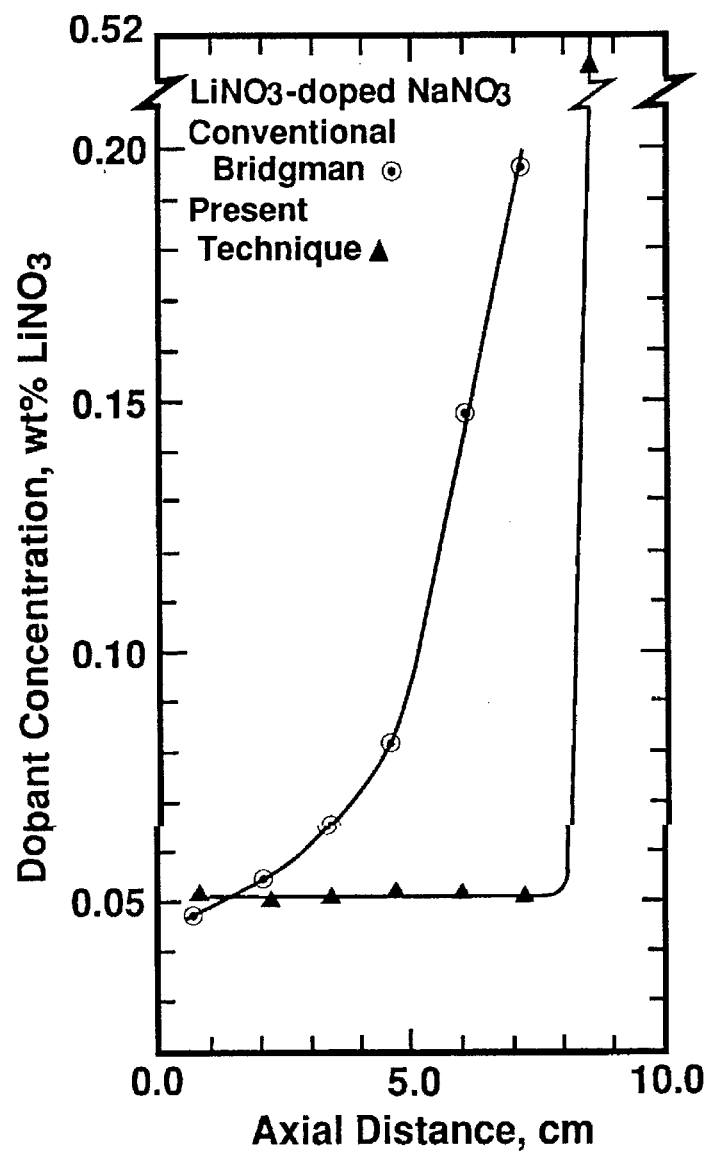
FIG. 13 is a graph showing the axial concentration distributions of $LiNO_3$ in $NaNO_3$ single crystals grown by conventional Bridgman and by using the device shown in FIG. 2.
Figure 14:
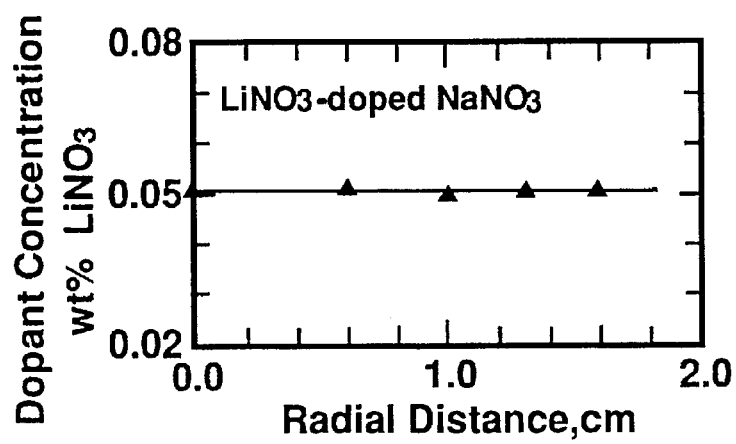
FIG. 14 is a graph showing the transverse concentration distribution of $LiNO_3$ in the modified-Bridgman $NaNO_3$ single crystal shown in FIG. 13.

A modified Bridgman method of crystal growth according to the embodiment shown in FIG. 2 was used to produce a LiNO$_3$-doped NANO$_3$ single crystal. The container 24, replenishing crucible 38 and the spiral tube 40 were all prepared from Pyrex glass, which is chemically compatible with the NaNO$_3$ melt. The container 24 (3.7 cm ID) was lowered initially at 0.5 cm/hr and at 1 cm/hr after the commencement of replenishing. The immersed crucible moved with the container before being stopped to cause replenishing. The spiral tube 40 was 11 cm long and around 0.2 cm ID. The time interval between melting and replenishing was about 16 hours, i.e., $2\sqrt{Dt}$ being around 3.5 cm. The axial LiNO$_3$ distribution along the resultant crystal is shown in FIG. 13. It is uniform except in the final portion of the crystal where replenishing stopped. The radial LiNO$_3$ distribution, shown in FIG. 14, is also uniform. The axial LiNO$_3$ distribution in a crystal grown by conventional vertical Bridgman, also included in FIG. 13 for comparison, shows significant segregation over the entire crystal.

Example 3

Horizontal Growth of NaNO$_3$ Crystals

Figure 15:
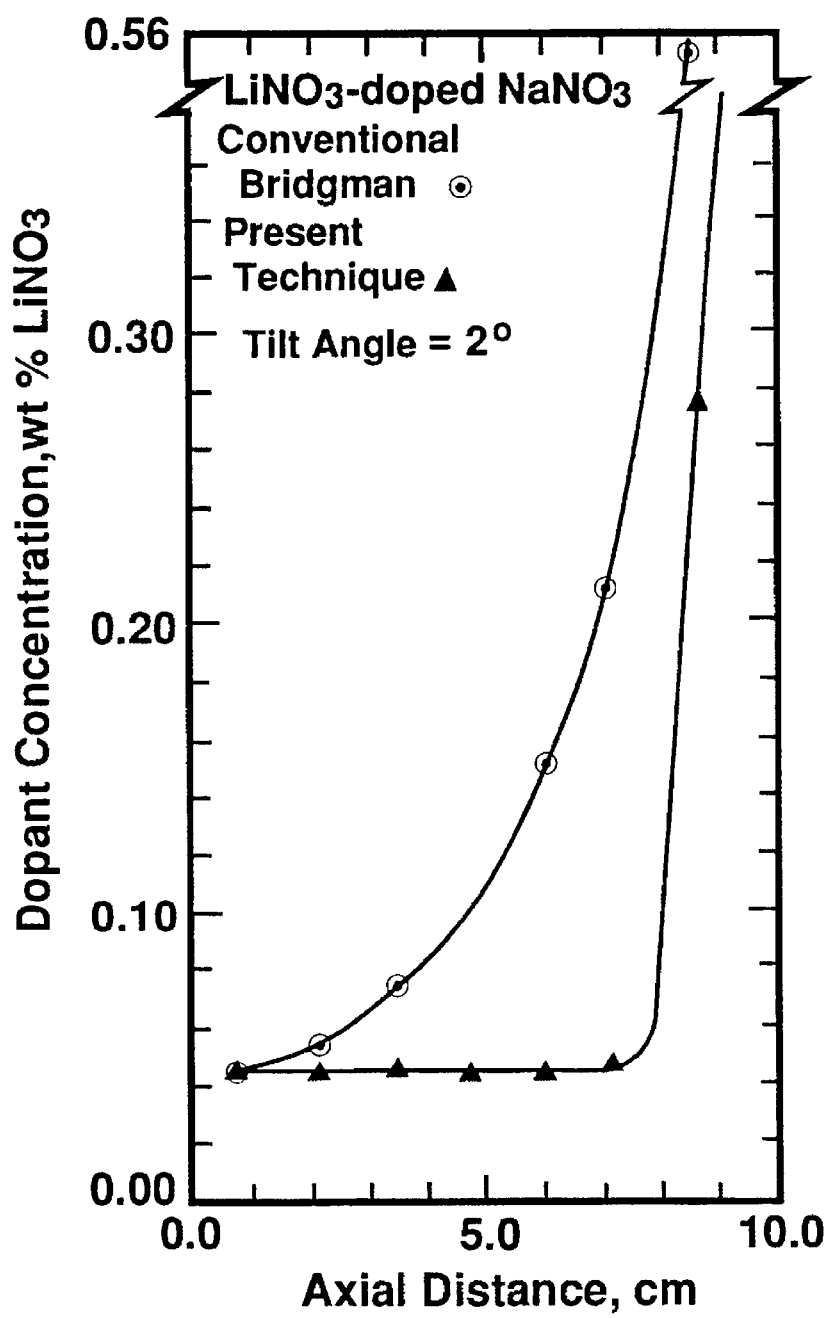
FIG. 15 is a graph showing the longitudinal concentration distributions of $LiNO_3$ in $NaNO_3$ single crystals grown by conventional Bridgman and by using the device shown in FIG. 8.
Figure 16:
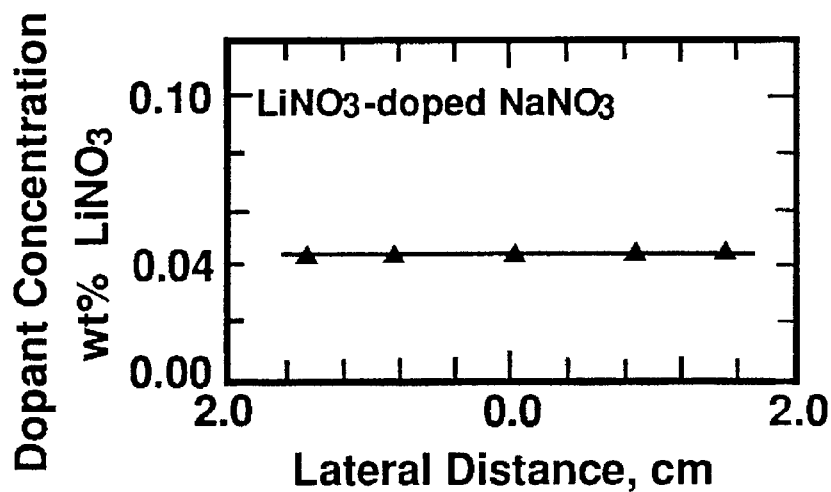
FIG. 16 is a graph showing the lateral concentration distribution of $LiNO_3$ in the modified-Bridgman $NaNO_3$ single crystal shown in FIG. 15.
Figure 17:
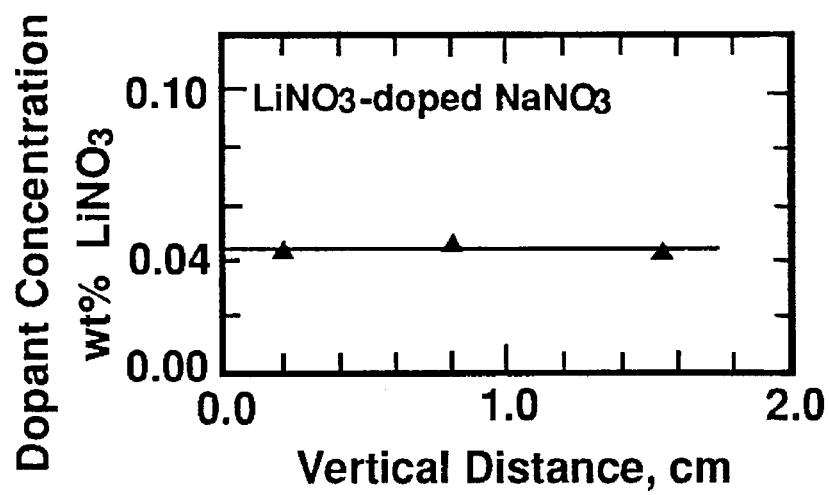
FIG. 17 is a graph showing the vertical concentration distribution of $LiNO_3$ in the modified-Bridgman $NaNO_3$ single crystal shown in FIG. 15.

A modified Bridgman method for crystal growth according to the embodiment shown in FIG. 8 was used to produce a LiNO$_3$-doped NaNO$_3$ single crystal. The container 24, i.e., the boat, was prepared from a Pyrex glass tube of 3.7 cm ID. The immersed baffle, 7.6 cm long and 3.6 cm in diameter, was prepared from aluminum. Aluminum is chemically compatible with and wetted by the NaNO$_3$ melt. The container was pulled at 0.5 cm/hr throughout crystal growth. The immersed baffle was riding along with the boat before being stopped to cause replenishing. The time interval between melting and replenishing was 16 hours, i.e., $2\sqrt{Dt}$ being around 3.5 cm. For NaNO$_3$, $\rho_S$=2.1 g/cm$^3$ and $\rho_L$=1.9 g/cm$^3$. A +2° tilt angle was used. The longitudinal LiNO$_3$ distribution along the resultant crystal is shown in FIG. 15. It is uniform except in the final portion of the crystal where the replenishing melt was used up. Without tilting, segregation was not reduced much. The lateral and vertical distributions, shown in FIGS. 16 and 17, are also uniform. The longitudinal distribution in a crystal grown by conventional horizontal Bridgman, also included in FIG. 14 for comparison, shows significant segregation over the entire crystal.

It is understood that the invention is not confined to the particular embodiments disclosed herein, but embraces all such forms as come within the scope of the following claims.

What is claimed is:

1. A method for producing homogeneous single crystals comprising the steps of:
   a. providing in a vertical container a first melt for crystal growth and a second melt of a different composition in a crucible above said first melt;
   b. cooling said container to initiate crystal growth from said first melt;
   c. moving a dummy into said crucible to cause said second melt to replenish and compensate for composition variations in said first melt.

2. The method of claim 1 wherein said container is rotated.

3. The method of claim 1 wherein said second melt is kept at a higher temperature than said first melt.

4. A method for producing homogeneous single crystals comprising the steps of:
   a. providing in a vertical container a first melt for crystal growth and a second melt of a different composition in a crucible immersed in said first melt, said crucible having an elongated passageway to suppress diffusion between said melts;

b. cooling said container to initiate crystal growth from said first melt;

c. increasing the distance between said crucible and the bottom of said container to cause said second melt to leak out through said passageway to replenish and compensate for composition variations in said first melt.

5. The method of claim 4 wherein the length of said passageway is at least $2\sqrt{Dt}$, where D is the diffusion coefficient and t the time interval from providing said melts to the commencement of replenishing.

6. The method of claim 4 wherein said passageway is tubular.

7. The method of claim 4 wherein said passageway is horizontal.

8. The method of claim 4 wherein there is relative rotational motion between said container and said crucible.

9. The method of claim 4 wherein a liquid encapsulant covers said melts.

10. A method for producing homogeneous single crystals comprising the steps of:

a. providing in a vertical container a first melt for crystal growth at the bottom and a second melt of a different composition at the top, said melts being separated by a submerged baffle to form a passageway at least $2\sqrt{Dt}$ in length, where D is the diffusion coefficient and t the time interval from providing said melts in said container to when said first melt is to be replenished;

b. cooling said container to initiate crystal growth from said first melt;

c. increasing the distance between said submerged baffle and the bottom of said container to cause said second melt to go through said passageway to replenish and compensate for composition variations in said first melt.

11. The method of claim 10 wherein a thermocouple is provided to monitor the temperature at the bottom of said submerged baffle.

12. The method of claim 10 wherein said passageway is coil-like in shape.

13. The method of claim 10 wherein said second melt is kept at a higher temperature than said first melt.

14. A method of claim 10 wherein said second melt is covered with a liquid encapsulant.

15. A method for producing homogeneous single crystals comprising the steps of:

a. providing in a boat a first melt for crystal growth and a second melt of a different composition, said melts being separated by an immersed baffle to form a passageway between said melts;

b. cooling said boat to initiate crystal growth from said first melt;

c. increasing the distance between said immersed baffle and the cooling end of said boat to cause said second melt to go through said passageway to replenish and compensate for composition variations in said first melt.

16. The method in claim 15 wherein said passageway is at least $2\sqrt{Dt}$, where D is the diffusion coefficient and t the time interval from providing said melts in said boat to the commencement of replenishing.

17. The method of claim 15 wherein said passageway is formed between said immersed baffle and the inner wall of said boat.

18. The method of claim 15 wherein said passageway is a through hole in said immersed baffle connecting said melts.

19. The method of claim 15 wherein said boat is tilted.

20. The method of claim 15 wherein said second melt is kept at a higher temperature than said first melt.

* * * * *